(12) United States Patent
Levin

(10) Patent No.: US 6,882,947 B2
(45) Date of Patent: Apr. 19, 2005

(54) DISCRETE FOURIER TRANSFORM (DFT) LEAKAGE REMOVAL

(75) Inventor: Harold J. Levin, Canton, MA (US)

(73) Assignee: Teradyne, Inc., Boston, MA (US)

( * ) Notice: Subject to any disclaimer, the term of this patent is extended or adjusted under 35 U.S.C. 154(b) by 472 days.

(21) Appl. No.: 10/036,000

(22) Filed: Dec. 31, 2001

(65) Prior Publication Data

US 2004/0122608 A1 Jun. 24, 2004

(51) Int. Cl.$^7$ .............................................. G06F 19/00
(52) U.S. Cl. ........................ 702/77; 324/620; 324/627; 324/624; 324/76.21
(58) Field of Search ............................. 702/77, 75, 7.6; 708/403, 404, 405; 324/520, 612, 620, 623, 624, 76.19, 76.21

(56) References Cited

U.S. PATENT DOCUMENTS

| | | | |
|---|---|---|---|
| 4,319,329 A | | 3/1982 | Girgis et al. ................ 364/484 |
| 4,686,457 A | | 8/1987 | Banno ......................... 324/77 |
| 5,610,847 A | | 3/1997 | Kundert ...................... 364/576 |
| 5,809,133 A | * | 9/1998 | Bartkowiak et al. ........ 379/386 |
| 6,046,977 A | * | 4/2000 | Bartkowiak ................. 370/210 |
| 6,240,129 B1 | * | 5/2001 | Reusens et al. ............. 375/222 |
| 6,298,363 B1 | * | 10/2001 | Iannuzzelli .................. 708/400 |
| 6,587,559 B1 | * | 7/2003 | Bartkowiak ................. 379/386 |
| 6,687,630 B1 | * | 2/2004 | Dionne ......................... 702/76 |

FOREIGN PATENT DOCUMENTS

EP    0297418    6/1988    .......... G01R/23/15

OTHER PUBLICATIONS

Xi et al., "A New Algorithm for Improving the Accuracy of Periodic Signal Analysis", IEEE, 1996.*
Minett et al., "A Fuzzy Discrete Fourier Transform for Reduction of Spectral Leakage", IEEE, 1997.*
U.S. Appl. No. 09/896,788, filed Jun. 29, 2001, Dionne.
Refining the digital spectrum David, P.A.M.–S.; Szczupak, J., Circuits and Systems, 1996., IEEE 39th Midwest symposium on , vol.: 2 , 1996, Page(s): 767–770 vol. 2.
Quasi–synchronous sampling algorithm and its applications Xianzhong Dai; Gretsch, R., Instrumentation and Measurement, IEEE Transactions on , vol.: 43 Issue: 2 , Apr. 1994, Page(s): 204–209.

* cited by examiner

Primary Examiner—Patrick Assouad
(74) Attorney, Agent, or Firm—Teradyne Legal Department

(57) ABSTRACT

A technique for measuring spectral components, such as noise and distortion, of a non-coherently sampled test signal containing at least one tone of known frequency includes modeling the spectral components of the at least one tone, including the effects of leakage, based upon frequency of the at least one tone and a plurality of known sampling parameters. A DFT is taken of the sampled test signal, and the DFT is adjusted based on the modeled spectral components. The adjusted DFT is substantially leakage-free and directly reveals spectral components of the test signal, including low-power components that would ordinarily be lost in the leakage errors.

20 Claims, 3 Drawing Sheets

Prior Art

DISCRETE FOURIER TRANSFORM (DFT) LEAKAGE REMOVAL

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to methods and equipment for testing electronic devices, and more particularly to techniques for accurately analyzing the spectra of non-coherently sampled test signals.

2. Description of Related Art Including Information Disclosed Under 37 C.F.R. 1.97 and 1.98

Test programs for automatic test equipment (ATE) commonly measure the spectra of signals sampled from devices under test (DUTs). FIG. 1 shows a conventional test scenario. An automatic test system 110 includes a host computer 112 that runs a test program. The test program activates a signal source 114 to apply a stimulus, which generally comprises one or more test tones, to the input of a DUT 120. A capture instrument 116 samples an output signal from the DUT 120 as it responds to the stimulus. The output signal from the DUT 120 includes the test tones, as well as noise and distortion. Tester software computes a Discrete Fourier Transform (DFT) of the output signal to produce a power spectrum. The magnitudes of the test tones are reported as the power levels of the DFT at frequencies corresponding to the test tones. Noise and distortion can be reported as the power levels of the DFT at all other frequencies.

As is known, "leakage" error manifests itself in the DFT of a sampled test signal whenever the sample clock is not "coherent" with the tones of the input signal. Leakage is the mathematical consequence of performing a DFT on truncated tones—i.e., tones that do not complete an integer number of cycles within the sample window. Leakage can be observed as an erroneous broadening of spectral lines, a creation of false peaks and troughs (lobes), and a general elevation of the power spectrum's noise floor. A sample clock is "coherent" with a test signal if its period multiplied by the number of captured samples is a precise integer multiple of the period of each tone in the test signal.

An important characteristic of ATE is the ability to measure accurately noise and distortion from devices under test. Leakage directly impairs a test system's ability to measure noise and distortion by elevating the apparent noise floor of a DFT to a point where the noise and distortion from the device can no longer be observed. Leakage also impairs the test system's ability to measure the magnitudes of the test tones themselves, because leakage induced from one test tone affects the magnitude of that test tone, as well as the magnitudes of all the other test tones.

Several techniques have been used to reduce leakage. One technique is to multiply the sampled sequence by a windowing function that gradually tapers the sampled sequence to zero at its endpoints. The windowing function forces the windowed sequence to be periodic, and therefore coherent, within the sample window. It accomplishes this, however, at the expense of distorting the spectrum of the sampled signal and increasing the number of samples that must be captured, and therefore increasing the test time.

Another technique is to mathematically convert the actual sampling rate to a rate that is coherent with the tones in the sampled signal. Sample rate conversion works by interpolating between actual points sampled at one rate to mathematically construct a series of points that appear to have been sampled at another rate. Although sample rate conversion can reduce leakage, it requires significant computation time and its accuracy can suffer from interpolation errors.

Still another technique is to vary the rate of the actual sampling clock to ensure coherency. For example, in FIG. 1, values $K_1$ and $K_2$ of dividers 124 and 126 are programmed to ensure that the width of the sampling window precisely equals an integer multiple of the period of every tone in the sampled signal. This technique is effective but requires expensive and complex hardware. It is particularly expensive when a tester includes a large number of sample clocks, as is often the case.

Manufacturers of automatic test equipment seek to improve their products by providing less costly solutions to conventional testing problems. Great benefits can be gleaned from increasing tester performance while decreasing tester cost and complexity. To this end, there is a strong incentive for inexpensively and conveniently reducing leakage to allow test systems to accurately measure the spectra of captured test signals.

BRIEF SUMMARY OF THE INVENTION

With the foregoing background in mind, it is an object of the invention to measure accurately spectral components, such as noise and distortion, by reducing the effects of leakage on the spectra of non-coherently sampled test signals.

To achieve the foregoing object, as well as other objectives and advantages, a technique according to the invention includes modeling the spectral components of one or more expected tones of a test signal, including the effects of leakage, based upon the frequency of the expected tone or tones a plurality of known sampling parameters. A DFT is taken of the sampled test signal, and the DFT is adjusted based on the modeled spectral components. The adjusted DFT is substantially leakage-free and directly reveals the components in the test signal, including low-power components that would ordinarily be lost in the leakage errors.

BRIEF DESCRIPTION OF THE SEVERAL VIEWS OF THE DRAWINGS

Additional objects, advantages, and novel features of the invention will become apparent from a consideration of the ensuing description and drawings, in which—

DETAILED DESCRIPTION OF THE INVENTION

The technique according to the invention virtually eliminates leakage from the spectra of non-coherently sampled waveforms when the error in the actual sampling rate is known. To introduce the principles behind the invention, consider first a discrete-time test signal x[k] having a continuous-time spectrum X(f). Consider also a discrete-time, rectangular window function, w[k], which is defined as $$w[k] = 1, k = 0 \text{ to } N-1$$
$$= 0, \text{ otherwise}$$

As is known, the continuous-frequency spectrum of w[k] is given by $$W(f) = e^{(-j2\pi f(N-1)/2)} \sin(\pi f N)/\sin(\pi f), \quad (1)$$

which is the discrete-time version of the well-known sin(x)/x, or sinc, function. Analyzing x[k] over an interval of N samples effectively multiplies x[k] by w[k] in the discrete-time domain, which corresponds to a convolution of X(f) with W(f) in the frequency domain.

For illustrative purposes, we assume that x[k] is a single pure tone $A\sin(2\pi F_t)$, where the magnitude A is a complex number (thereby allowing x[k] to have a non-zero phase). The spectrum of x[k] has two frequency components: a first component at $F_t$ having amplitude A/2 and a second component at $-F_t$ having amplitude $A^*/2$ ("*" denotes complex conjugate). The convolution of X(f) with W(f) therefore produces a pair of frequency-shifted rectangular window functions, which add together to yield the spectrum of the sampled tone. This spectrum can be expressed in the following general form, $$X_W(f) = X(f) \otimes W(f) = A/2 \; (W(f-F_t)) + A^*/2(W(f-(F_s-F_t))), \quad (2)$$

where $F_s$ is the sampling rate and "$\otimes$" designates convolution. By dividing each frequency by $F_s$, we can normalize (2) as follows:

$$X_W(f_N) = A/2(W(f_N - F_t/F_s)) + A^*/2(W(f_N - (1-F_t/F_s))), \quad (3)$$

Figure 2A:
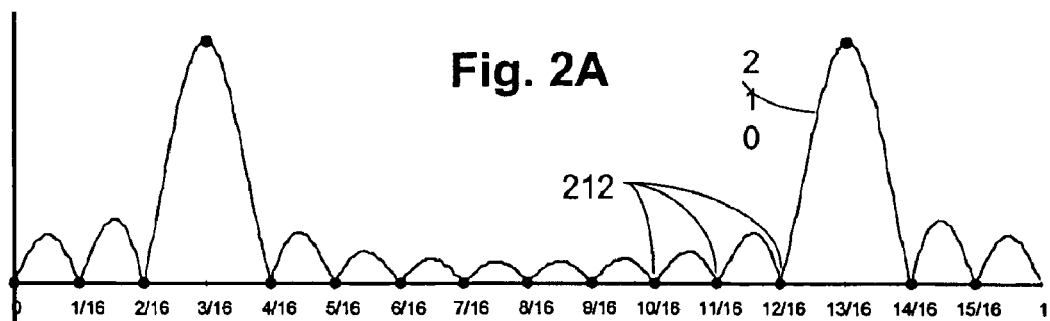
FIGS. 2A–2D are spectra of different test signals shown to illustrate the principles of the invention.

FIG. 2A shows the magnitude of $X_W(f)$ as a function of normalized frequency, where $F_s \equiv 1$, and $F_t = 3/16$. As shown in FIG. 2A, $X_W(f_N)$ has a first peak at $3/16$, which corresponds to $F_t$, and a second peak at $13/16$ (1-$3/16$), which corresponds to $F_s - F_t$.

FIG. 2A might appear odd at first glance, because it shows the "continuous" spectrum 210 of the discrete-time signal x[k]. This is seldom observed. Instead, we normally observe what amounts to a sampled version of $X_W(f_N)$ in the form of a DFT. As is known, a DFT is a "discretized" version of the continuous Fourier transform, which effectively "samples" the Fourier transform at regular intervals. The points 212 in FIG. 2A represent the DFT of the sampled test signal. When using a DFT, we see only these points 212, and the underlying structure 210 of the Fourier transform is masked. It is crucial to recognize, however, that the underlying structure 210 is the actual spectrum of the windowed, sampled tone. The DFT is merely a group of regularly spaced samples taken from the larger structure.

$X_W(f)$ has the property that it peaks at precisely the tone frequency (and its reflection from $F_s$) and goes to zero at all other points where $f_N$ is an integer (See Eq. 1). When x[k] is coherently sampled, as it is in FIG. 2A, these peaks and zeros fall at precisely the points where a DFT would sample the spectrum. The resulting DFT returns non-zero values only at the tone frequencies, and returns zeroes at all other frequencies.

Figure 2B:
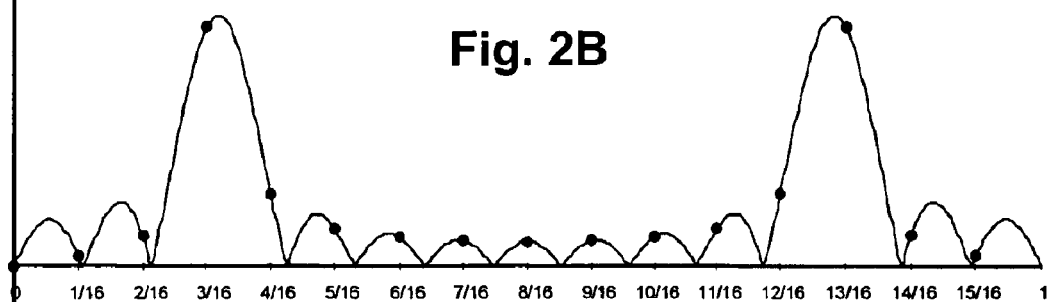

This simple pattern breaks down, however, when x[k] is sampled with a non-coherent clock. In FIG. 2B, the normalized frequency of x[k] is changed from $3/16$ to $3.2/16$, resulting in a non-coherent capture. Although the Fourier transform accurately reflects the magnitude of the sampled signal's spectrum, its peaks and zeroes do not coincide with the samples of the DFT. Rather than having the simple form that it did in FIG. 2A, the DFT of FIG. 2B suffers from leakage.

Ordinarily, one does not know in advance the frequencies of signals upon which DFT's are taken, and leakage errors impair DFT accuracy. In ATE, however, the reverse is generally true. Test frequencies are almost always known in advance. A test engineer applies known stimuli to a DUT and samples the DUT's output at a known sampling rate. Output signals from the DUT generally have the same frequencies as input signals, or related frequencies such as harmonics and mixing products. Conventionally, test engineers have applied this knowledge of test parameters to set up coherent captures. But because ATE presents a case in which frequencies are known in advance, it also presents an opportunity to correct for leakage.

Figure 3:
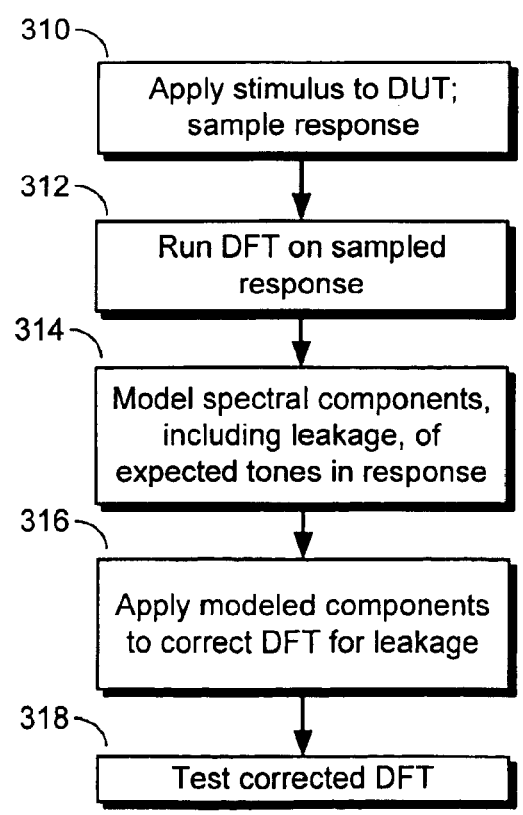
FIG. 3 is a simplified flow chart showing a process according to the invention for measuring the components in a non-coherently sampled signal.

FIG. 3 shows an overview of a process according to the invention for correcting leakage errors in the DFT's of non-coherently sampled test signals. At step 310, a test program directs a test system to apply a stimulus to a DUT and sample a response from the DUT. The response includes at least one tone having known frequency. At step 312, the test program runs a DFT on the sampled response. At step 314, the test program models the spectral components of the known tone or tones, including the effects of leakage induced by the known tone or tones. The modeled components are then applied to corresponding components of the DFT, at step 316, to yield an adjusted DFT. The adjusted DFT provides a substantially leakage-free spectrum of the sampled test signal, which the test program can evaluate (at step 318) to determine whether the DUT passes or fails.

Single Tone Correction

Applying this process to a single-tone test signal, we first consider the requirements for a coherent capture. To sample a test signal coherently, sampling parameters M (# of cycles of input tone), N (# of samples), and $F_s$ (sampling frequency) are established such that M and N are mutually prime, and $F_t/M = F_s/N$, or equivalently, $$F_t = MF_s/N. \quad (4)$$

Using these values, the DFT bins are spaced at integer multiples of $F_s/N$. Now assume that the capture is non-coherent, and that the sampling frequency is not exactly $F_s$ but rather $F_s'$:

$$F_s' = F_s/(1+\alpha), \quad (5)$$

where $\alpha$ is the ratio error. Rearranging terms and substituting $F_s$ from (5) into (4), we get—

$$F_t = (1+\alpha)F_s'M/N. \quad (6)$$

We can express (6) in normalized form by dividing all frequencies by $F_s'$:

$$F_t/F_s' = (1+\alpha)M/N, \quad (6)$$

where M/N is the normalized signal frequency. When $F_t/F_s'$ from (6) is substituted into (3), we obtain the following expression for the Fourier spectrum of the sampled, single-tone signal:

$$X_W(f_N) = A/2(W(f_N - (1+\alpha)M/N)) + A^*/2(W(f_N - (1-(1+\alpha)M/N))). \quad (7)$$

Equation 7 can be rendered in a form analogous to a DFT by "discretizing" $X_W(f_N)$, i.e., by sampling it at frequencies $f_N=0, 1/N, 2/N, k/N, \ldots, (N-1)/N$, as follows:

$$X_W[k]=A/2(W(k/N-(1+\alpha)M/N))+A*/2(W(k/N-(1-(1+\alpha)M/N))) \quad (8)$$

Equation (8) thus represents the discrete spectrum, including leakage, of the expected sampled test signal.

Although the frequency of the expected test tone is precisely known in advance, its amplitude is generally not known (a DUT generally does not have unity gain, so even if the amplitude of the stimulus is known, the amplitude of the response is generally not). To model the amplitude of $X_W[k]$, we apply an actual value taken from a DFT obtained using substantially the same values of M, N, and $F_s'$ that we used in modeling (8). We apply the measured value of the DFT in bin M (the tone frequency) to (8), as follows:

$$X_W[M]=DFT[M]=A/2(W(M/N-(1+\alpha)M/N))+A*/2(W(M/N-(1-(1+\alpha)M/N))) \quad (9)$$

We use bin M because it contains the largest expected tone, and thus can be measured more accurately than bins containing tones with much smaller magnitudes, which are more susceptible to noise and other errors. Other bins could theoretically be used, but with less satisfactory results. We can now solve for the two unknowns (A and A*) to complete our representation of $X_W[k]$. It may appear at first that (9) prescribes one equation in two unknowns. But by separating (9) into real and imaginary parts, we obtain two equations in two unknowns:

$$\text{Re}(DFT[M])=\text{Re}(A/2(W(M/N-(1+\alpha)M/N))+A*/2(W(M/N-(1-(1+\alpha)M/N)))) \quad (10)$$

$$\text{Im}(DFT[M])=\text{Im}(A/2(W(M/N-(1+\alpha)M/N))+A*/2(W(M/N-(1-(1+\alpha)M/N)))) \quad (11)$$

We can simplify the notation as follows:

Let $E_A=W(M/N-(1+\alpha)M/N)/2$

Let $E_B=W(M/N-(1-(1+\alpha)M/N))/2$, which allows us to rewrite (10) and (11):

$$\text{Re}(DFT[M])=\text{Re}(AE_A+A*E_B)$$

$$\text{Im}(DFT[M])=\text{Im}(AE_A+A*E_B).$$

We can also rewrite the complex products as follows:

$$AE_A=[\text{Re}(A)\text{Re}(E_A)-\text{Im}(A)\text{Im}(E_A)]+j[\text{Im}(A)\text{Re}(E_A)+\text{Re}(A)\text{Im}(E_A)]$$

$$AE_B=[\text{Re}(A)\text{Re}(E_B)-\text{Im}(A)\text{Im}(E_B)]+j[\text{Im}(A)\text{Re}(E_B)+\text{Re}(A)\text{Im}(E_B)]$$

$$A*E_A=[\text{Re}(A*)\text{Re}(E_A)-\text{Im}(A*)\text{Im}(E_A)]+j[\text{Im}(A*)\text{Re}(E_A)+\text{Re}(A*)\text{Im}(E_A)]$$

$$A*E_B=[\text{Re}(A*)\text{Re}(E_B)-\text{Im}(A*)\text{Im}(E_B)]+j[\text{Im}(A*)\text{Re}(E_B)+\text{Re}(A*)\text{Im}(E_B)]$$

By further recognizing that $\text{Re}(A*)=\text{Re}(A)$ and $\text{Im}(A*)=-\text{Im}(A)$, we can express (10) and (11) as two equations in two unknowns—Re(A) and Im(A):

$$\text{Re}(DFT[M])=\text{Re}(A)[\text{Re}(E_A)+\text{Re}(E_B)]-\text{Im}(A)[\text{Im}(E_A)-\text{Im}(E_B)] \quad (12)$$

$$\text{Im}(DFT[M])=\text{Re}(A)[\text{Im}(E_A)+\text{Im}(E_B)]+\text{Im}(A)[\text{Re}(E_A)-\text{Re}(E_B)] \quad (13)$$

Because all the terms in (12) and (13) are real numbers, these equations can be solved directly using linear algebra.

Once Re(A) and Im(A) are known, we can solve for A and A* by recognizing that $A=\text{Re}(A)+j\,\text{Im}(A)$ and $A*=\text{Re}(A)-j\,\text{Im}(A)$. These values of A and A* can be applied to (8) to generate any of the values of $X_W[k]$.

Until now we have assumed that the sampled signal is a pure tone. As we know, however, real test signals also include noise, distortion, and possibly other low-power components (herein referred to collectively as "NAD"). We can measure NAD by recognizing that $X_W[k]$ should precisely match the DFT, except for the NAD in the DFT. Mathematically, we can express this as follows:

$$NAD[k]=DFT[k]-X_W[k],\ k\neq M, \quad (14)$$

where NAD[k] represents noise, distortion, and other low-power components in bin k, and DFT[k] represents the value of the DFT in bin k. Because $X_W[k]$ includes the predicted leakage error, NAD[k] is substantially free of leakage and accurately represents the noise and distortion of the test signal.

Multitone Correction

This approach can be extended to test signals comprising any number of tones. Assume that the test signal contains p different pure tones, wherein each $i^{th}$ of the p tones has an amplitude of $A_i$, a normalized frequency of $M_i/N$, and a ratio error $\alpha_i$ (ratio errors for different tones are generally the same, but may differ, particularly in microwave testing, and so are allowed to differ here). In the frequency domain, each $i^{th}$ tone corresponds to a pair of frequency-shifted rectangular window functions—a first at $M_i/N$ and a second at $1-M_i/N$ (see (8) above). At the bin corresponding to each $i^{th}$ of the p tones, the modeled discrete spectrum $X_W[k]$ equals the sum of the contributions of rectangular window functions for each of the p tones:

$$X_W[k] = \sum_{i=1}^{p} [A_i/2(W(k/N - (1+\alpha_i)M_i/N)) + A_i^*/2(W(k/N - (1-(1+\alpha_i)M_i/N)))]. \quad (15)$$

Figure 2C:
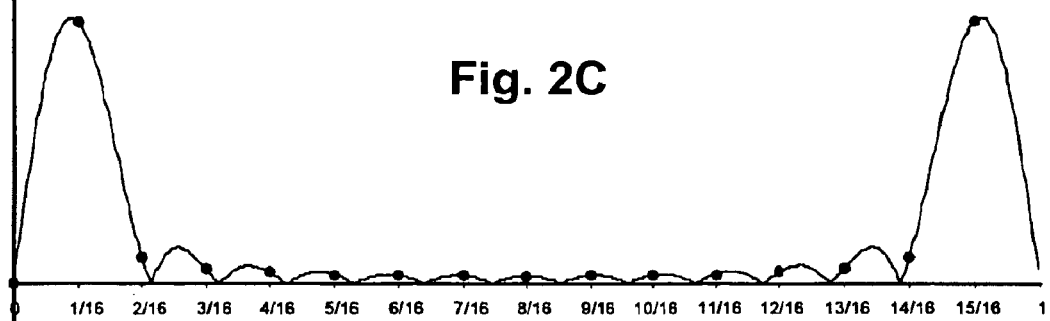
Figure 2D:
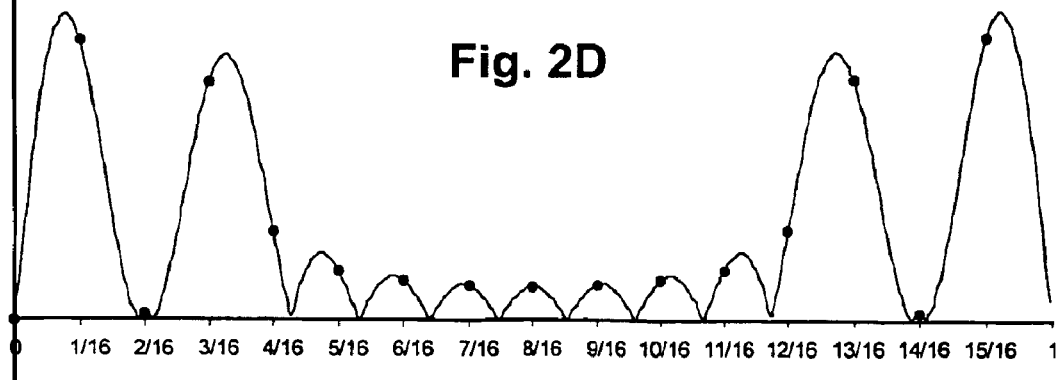

FIG. 2D shows a graphical example of this summation of window functions for two tones (in particular, a summation of the tone in FIG. 2B with the tone in FIG. 2C). As with (8) above, (15) does not reflect the amplitudes of the test tones. As we did above, we apply data from a DFT of the sampled test signal, acquired using substantially the same values of M and N that we used in modeling (15). We then apply the value of the DFT in each bin $M_k$ (each tone frequency) to (15), as follows:

$$X_W[M_k] = DFT[M_k] = \sum_{i=1}^{p} [A_i/2(W(M_k/N - (1+\alpha_i)M_i/N)) + A_i^*/2(W(M_k/N - (1-(1+\alpha_i)M_i/N)))]. \quad (16)$$

Equation (16) is the multitone version of (9), and degenerates to (9) for p=1. Because there are p different tones $M_k$, (16) expands into p different equations, one for each of $M_1, M_2, \ldots, M_p$. Each instance of (16) can be expressed, as in (10) and (11), as two equations, one for Re(DFT[$M_k$]) and one for Im (DFT[$M_k$]). This expansion yields 2p equations in 2p unknowns—Re($A_i$) and Im($A_i$). Each term in the expansion is a real number, which allows the system of equations to be solved using conventional linear algebra.

As before, we can determine each complex amplitude $A_i$ by recognizing that $A_i=\text{Re}(A_i)+j\,\text{Im}(A_i)$ and $A_i^*=\text{Re}(A_i)-j\,\text{Im}(A_i)$. Once we know $A_i$ and $A_i^*$, we can use (15) to solve $X_W[k]$ for any value of k. We can then solve for each of the NAD components:

$$NAD[k]=DFT[k]-X_W[k], \quad (17)$$

where $0 \leq k \leq N/2$, and $k \notin \{M_1, M_2, \ldots, M_p\}$. Equation 17 can be used for determining the leakage-corrected frequency component of any bin of the DFT.

So far we have considered only leakage errors caused by expected tones in the sampled signal. One might question whether the low-power components themselves contribute leakage errors. Although all of the frequency components in a non-coherently sampled signal (even noise and distortion) contribute leakage, the amplitude of leakage errors from any component is significantly lower than the amplitude of the component itself. Leakage from low-power components such as noise and distortion is therefore well below the level of these components and can be safely ignored.

In the preferred embodiment, the host computer 112 performs the mathematical operations under the direction of a test program. A DSP processor or special purpose hardware could be used in coordination with the host computer. Many of the mathematical computations required by this technique are identical for similar tests. Preferably, these identical computations are performed and stored for ready access by the tester during test execution. These terms may be stored when the test program is created, before the first execution of the test program, or the first time the test program is run.

Figure 4A:
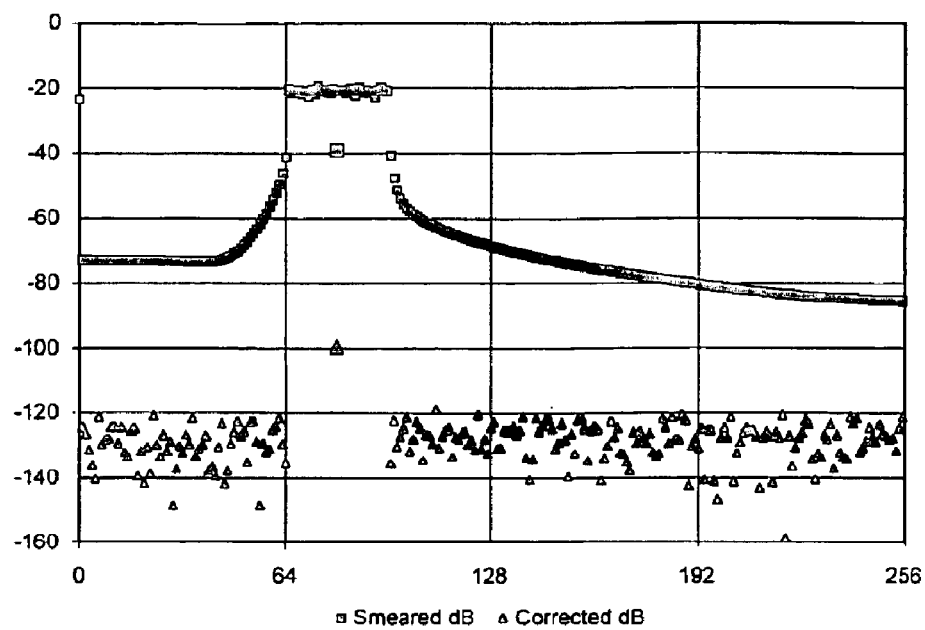
FIGS. 4A and 4B are charts showing the performance of the process of FIG. 3 for measuring signal components substantially without the effects of leakage.

A simulation was performed to test the multiple-tone correction algorithm. A 512 sample signal was created with 31 tones in bins 65, 66, ..., 79, 81, 82, ..., 96. Each tone was generated at amplitude 1.0, and a random starting phase that was uniformly distributed from 0 to $2\pi$. In place of the missing tone in bin 80, a spur was introduced at amplitude−100 dB to simulate intermodulation distortion. Uniformly distributed noise with peak-to-peak amplitude of 20 $\mu$V was added to each sample. Two sample sets were then generated: one with no coherence error, and the other with a coherence error ($\alpha$) of 1,000 ppm (parts per million). FIG. 4A shows the smeared and corrected spectra of the capture.

Three metrics were calculated to demonstrate the accuracy of the algorithm:
1. SNR: ratio of sum of signal bins to sum of all noise bins other than the spur in bin 80;
2. Spur: magnitude of spur in bin 80;
3. SFDR: magnitude of largest noise spur, excluding bin 80.

Figure 4B:
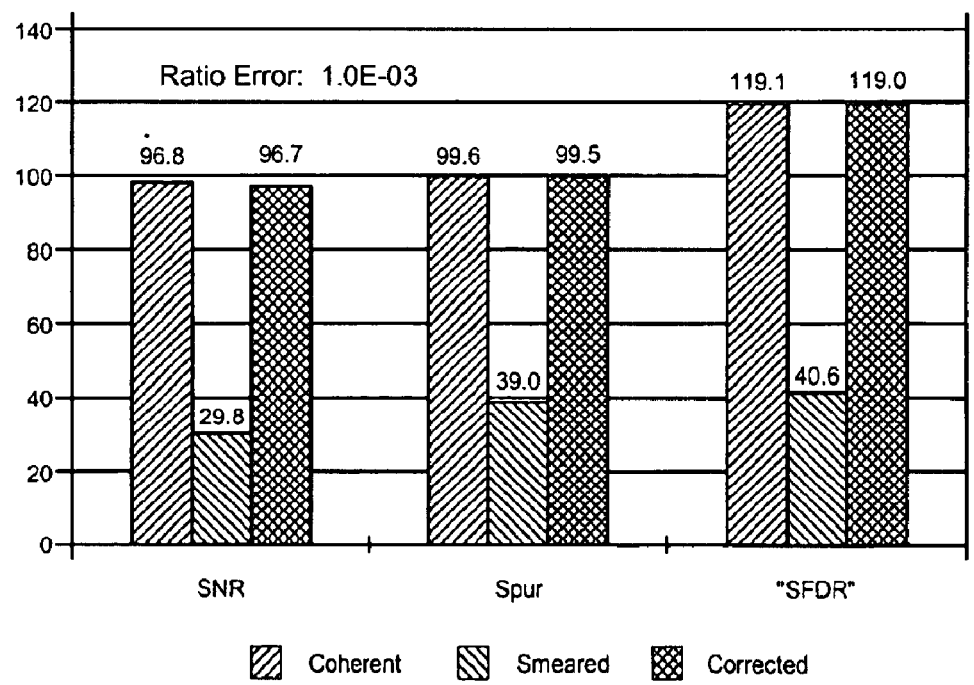

These metrics were calculated for the coherent data, smeared data, and corrected data. As can be seen in FIG. 4B, the coherent and corrected metrics are all within 0.1 dB of each other. Furthermore, the algorithm removed 66.9 dB, 60.5 dB, and 78.4 dB of coherence error from the SNR, spur, and SFDR metrics, respectively.

Alternatives

Having described one embodiment, numerous alternative embodiments or variations can be made.

As described above, the technique requires that the tones in the input signal be known in advance. This requirement can be avoided, however, by scanning the DFT of the sampled test signal and examining the results. Peaks can be identified in the resulting power spectrum, and the frequencies corresponding to the peaks can be used as the tones upon which the process is operated. The technique can also take into account attendant circumstances in identifying the tones of the test signal, such as harmonics of frequencies applied to the DUT and known characteristics of the DUT.

As described above, the amplitudes of the tones of $X_W[k]$ are established by applying one or more DFT measurements (See equations 9 and 16). Although DFT measurements provide accurate results, they are not strictly required. Alternatively, the amplitudes of the tones could be estimated rather than measured. Leakage errors would then be reduced in direct proportion to the accuracy of the estimated amplitudes.

Figure 1:
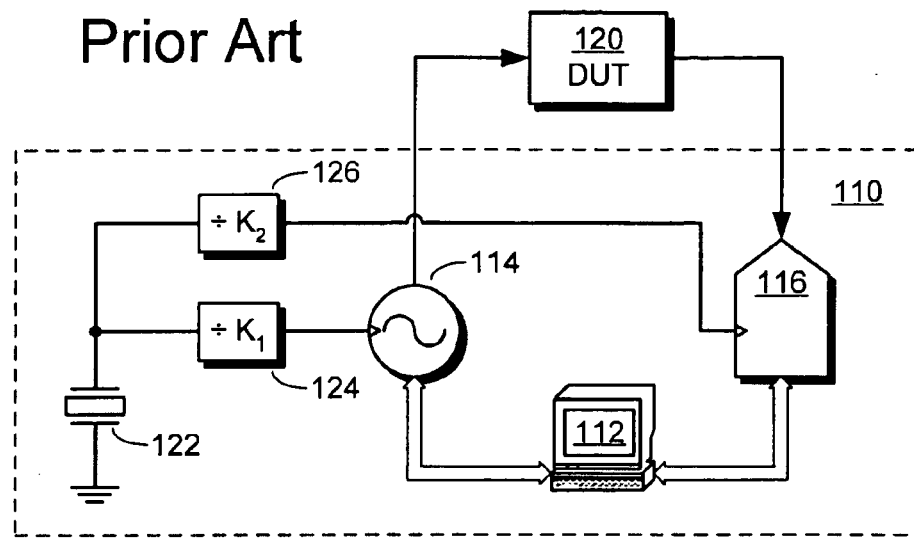
FIG. 1 is a highly simplified block diagram of an automatic test system with which the invention may be employed.

The technique has been described above as pertaining to the particular test scenario of FIG. 1. It should also be understood that the mathematical descriptions of the invention included herein can be expressed in various equivalent terms, via well-known mathematical transformations and/or substitutions, which accomplish the same or substantially similar results. Different expressions of the same underlying concepts are intended to fall within the scope of the invention. For example, we have defined $\alpha$ as a ratio error that represents the degree to which a capture is non-coherent. Non-coherency can be expressed in a number of different ways, however, the specific form of which is not critical to the invention.

When a single tone test signal is involved, the technique for measuring NAD can be simplified as follows. By recognizing that leakage errors are exceedingly small near the peak of a tone's spectrum, we can substitute the peak actual DFT value for the single tone case in place of the complex amplitudes A and A*. We can then determine the total noise and/or distortion as—

$$NAD[k] \approx DFT[k] - [DFT[M]/2(W(k/N-(1+\alpha)M/N)) + DFT[M]^*/2(W(k/N-(1-(1+\alpha)M/N)))],$$

thus avoiding the need to solve for A and A*. This method of correcting leakage does not account for the leakage error of the tone bin of the DFT, however, and thus provides less accurate correction than the general solution described above.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A method for measuring low-power components of non-coherently sampled test signals that include at least one tone each having a known frequency, comprising:
   executing a Discrete Fourier Transform (DFT) on the sampled test signal;
   modeling spectral components of the at least one tone, including effects of leakage induced by the at least one tone; and
   adjusting the DFT by an amount prescribed by the modeled spectral components to provide a substantially leakage-free measure of low-power components of the test signal.

2. A method as recited in claim 1, wherein the step of modeling includes modeling at least one spectral component of the at least one tone.

3. A method as recited in claim 2, wherein the step of modeling accounts for the known frequency of each expected tone and a plurality of known sampling parameters related to sampling the test signal.

4. A method as recited in claim 3, wherein the step of modeling includes applying actual values from the DFT to determine the amplitude each of expected tone in the modeled spectrum.

5. A method as recited in claim 4, wherein the actual values from the DFT correspond to bins of the DFT containing each expected tone.

6. A method as recited in claim 3, wherein plurality of known sampling parameters includes the number of cycles $M_i$ of each expected tone of the test signal within the sample window, the number of samples N within the sample window, and the sampling rate $F_s$.

7. A method as recited in claim 6, wherein the modeled spectral components have substantially the form—

$$X_W[k] = \sum_{i=1}^{p} [A_i/2(W(k/N - (1+\alpha_i)M_i/N)) + A_i^*/2(W(k/N - (1 - (1+\alpha_i)M_i/N)))],$$

wherein
- k is any bin of the predicted DFT,
- $A_i$ is the complex amplitude of the component in bin k,
- p is the number of test tones in the test signal,
- $\alpha_i$ is a ratio error in the sampling of the $i^{th}$ test tone, and $W(f) = e^{(-j2\pi f(N-1)/2)} \sin(\pi f N)/\sin(\pi f)$.

8. A method as recited in claim 7, wherein α represents an ideal, coherent sampling rate $F_s$ divided by the actual sampling rate $F_s'$, minus one, or $\alpha = F_s/F_s' - 1$.

9. A method as recited in claim 1, wherein the low-power components comprise noise and distortion in the test signal.

10. A method as recited in claim 1, wherein the step of adjusting the DFT includes subtracting a modeled spectral component from the value of each corresponding bin of the DFT.

11. An apparatus for measuring low-power components of non-coherently sampled test signals including at least one tone each having a known frequency, comprising:
- means for executing a Discrete Fourier Transform (DFT) of a sampled test signal;
- means for modeling spectral components of the at least one tone, including effects of leakage induced by the at least one tone; and
- means for adjusting the DFT by an amount prescribed by the modeled spectral components to generate a substantially leakage-free measure of noise and distortion in the test signal.

12. An apparatus as recited in claim 11, wherein plurality of known parameters include the number of cycles $M_i$ of each test tone of the test signal within the sample window, the number of samples N within the sample window, and the sampling rate $F_s$.

13. An apparatus as recited in claim 12, wherein the modeled spectral components have substantially the form—

$$X_W[k] = \sum_{i=1}^{p} [A_i/2(W(k/N - (1+\alpha_i)M_i/N)) + A_i^*/2(W(k/N - (1 - (1+\alpha_i)M_i/N)))],$$

wherein
- k is any bin of the predicted DFT,
- $A_i$ is the complex amplitude of the component in bin k,
- p is the number of tones in the test signal,
- $\alpha_i$ is a ratio error in the sampling of the $i^{th}$ test tone, and $W(f) = e^{(-j2\pi f(N-1)/2)} \sin(\pi f N)/\sin(\pi f)$.

14. An apparatus as recited in claim 13, wherein α represents the ideal, coherent sampling rate $F_s$ divided by the actual sampling rate $F_s'$, minus one, or $\alpha = F_s/F_s' - 1$.

15. A method for testing the a non-coherently sampled test signal including at least one tone each having a known frequency, comprising:
- applying a stimulus signal to an input of a device under test;
- sampling a test signal from an output of the device under test;
- executing a Discrete Fourier Transform (DFT) on the sampled test signal;
- modeling the spectrum of the at least one tone, including effects of leakage induced by the at least one tone; and
- adjusting the DFT by an amount prescribed by the modeled spectrum to generate a substantially leakage-free DFT of the test signal.

16. A method as recited in claim 15, further comprising comparing bins of the adjusted DFT with one or more threshold levels to determine whether the device under test passes or fails.

17. A method as recited in claim 16, further comprising testing a plurality of devices.

18. An apparatus for testing a non-coherently sampled test signal including at least one tone each having a known frequency, comprising:
- a stimulus circuit for applying a stimulus signal to an input of a device under test;
- a sampling circuit for sampling a test signal from an output of the device under test;
- means for executing a Discrete Fourier Transform (DFT) on the sampled test signal;
- means for modeling the spectrum of the at least one tone, including effects of leakage induced by the at least one tone; and
- means for adjusting the DFT by an amount prescribed by the modeled spectrum to generate a substantially leakage-free DFT of the test signal.

19. An apparatus as recited in claim 18, further comprising means for comparing bins of the adjusted DFT with one or more threshold levels to determine whether the device under test passes or fails.

20. An apparatus as recited in claim 19, further comprising means for testing a plurality of devices.

* * * * *